United States Patent [19]

Ryan et al.

[11] Patent Number: 4,490,087
[45] Date of Patent: Dec. 25, 1984

[54] ELEVATING JIG FOR SEMI-CONDUCTOR WAFERS AND SIMILAR ARTICLES

[75] Inventors: John F. Ryan, San Diego; John G. Wright, Poway, both of Calif.

[73] Assignee: Northern Telecom Limited, Quebec, Canada

[21] Appl. No.: 402,264

[22] Filed: Jul. 27, 1982

[51] Int. Cl.³ .............................................. B65G 65/30
[52] U.S. Cl. ................................... 414/417; 414/786; 432/239; 206/334; 206/454
[58] Field of Search .............. 414/417, 786; 432/239, 432/253, 258; 206/45, 45.14, 334, 454, 527; 312/73; 269/13, 903; 198/345, 472

[56] References Cited

U.S. PATENT DOCUMENTS

| | | | |
|---|---|---|---|
| 2,962,178 | 11/1960 | Exline | 414/417 |
| 3,190,438 | 6/1965 | Cain et al. | 206/45 |
| 3,426,922 | 2/1969 | Massey | 414/417 X |
| 3,432,027 | 3/1969 | Mueller | 206/527 |
| 3,476,265 | 11/1969 | Powers | 198/345 X |
| 3,780,892 | 12/1973 | Frank | 414/417 X |
| 3,926,323 | 12/1975 | Frank et al. | 414/417 |
| 4,108,323 | 8/1978 | Shambelan et al. | 414/417 |
| 4,147,250 | 4/1979 | Schulz | 198/472 |
| 4,311,427 | 1/1982 | Coad et al. | 414/417 X |

Primary Examiner—Joseph E. Valenza
Assistant Examiner—David A. Bucci
Attorney, Agent, or Firm—Schwartz, Jeffery, Schwaab, Mack, Blumenthal & Koch

[57] ABSTRACT

An elevating jig, particularly suitable for elevating selected semi-conductor wafers in boat or holding member, has a base and a plurality of removable lift members which fit in apertures in the base. A locating member is provided at one end of the base for positioning a holding member on the base and the apertures in the base are at predetermined positions from the locating member. Lift members can be positioned as desired and when a holding member is placed on the jig certain wafers are lifted up, enabling easy withdrawal.

6 Claims, 4 Drawing Figures

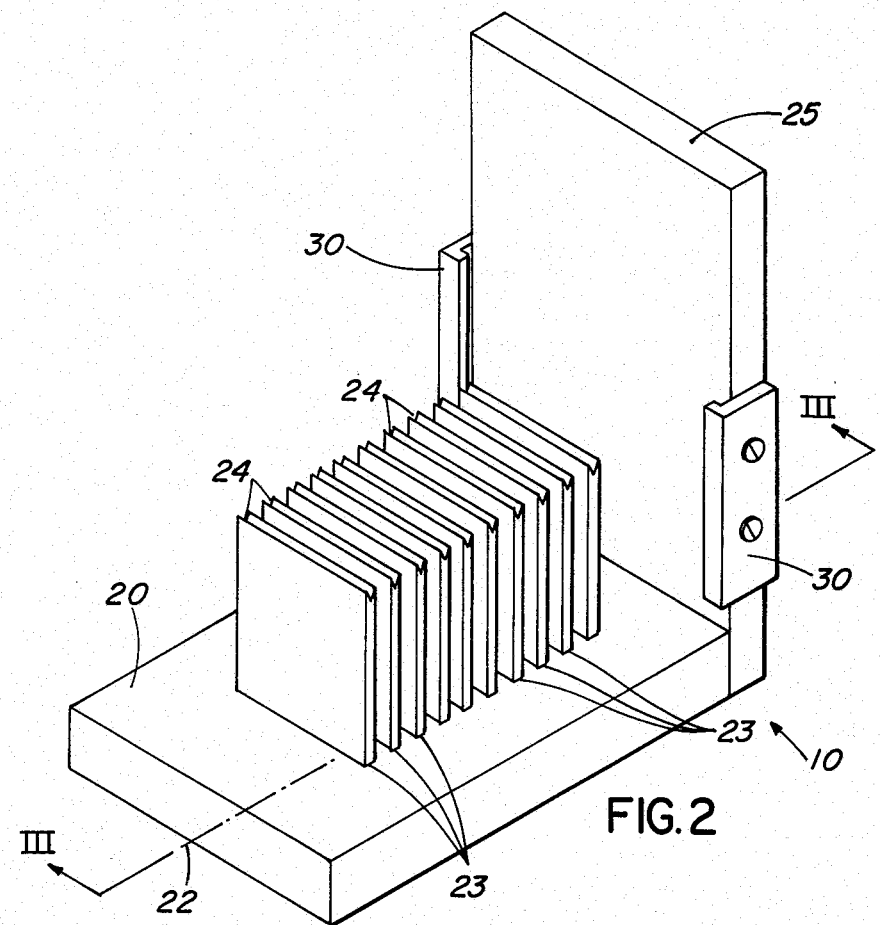
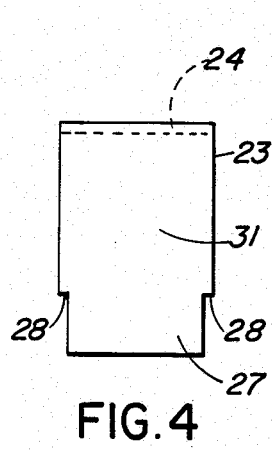
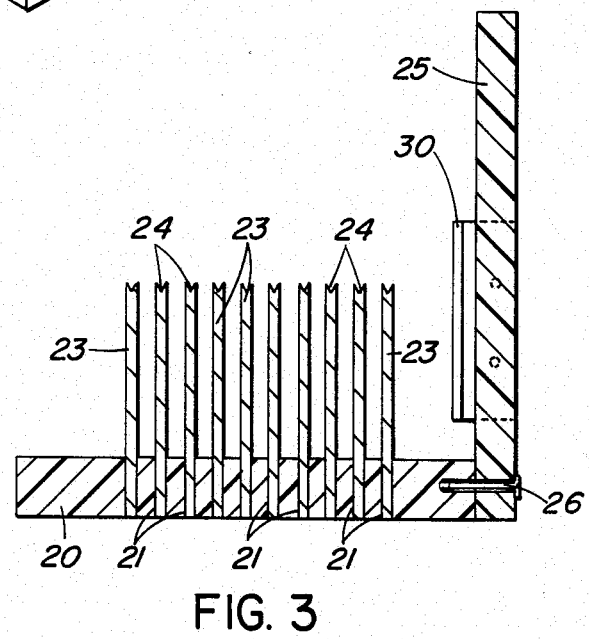
FIG. 2
FIG. 4
FIG. 3

ELEVATING JIG FOR SEMI-CONDUCTOR WAFERS AND SIMILAR ARTICLES

This invention relates to an elevating jig, particularly for semiconductor wafers and like articles which are positioned in parallel close array in a holding member.

Semiconductor wafers are held for processing in furnaces, and may be stored, in members holding a relatively large number of wafers in a parallel closely spaced array. At various times it is desired to remove one or more wafers for inspection, and test. This is done conventionally by abstracting a wafer by a pair of tweezers or tongs. Such removal is difficult, because of the close spacing. Damage can occur to adjacent wafers and to the wafer being removed. This situation is compounded by the fact that in many cases two wafers are supported back-to-back at each position.

The present invention provides a jig which on positioning the holding member on the jig, lifts one or more wafers, at predetermined positions, above the remainder of the wafers, enabling the removal of the wafer, or wafers, to be accomplished easily and with minimum risk of damage to other wafers and to the wafer being removed.

The jig can also be used to provide a similar facility for removing samples from boxed items, the only requirement being that access through the bottom of the storage or holding member is possible.

The invention, in the broad aspect, comprises a base member having removably mounted thereon one or more upwardly extending lift members, and a locating member at one end. Where a plurality of lift members are provided, they are spaced apart at predetermined spacings. The position of the locating member relative to the lift member or members is also predetermined. The number of lift members can be varied.

The invention will be readily understood by the following description of an embodiment by way of example, in conjunction with the accompanying drawings, in which:

FIG. 2 is a perspective view of the jig illustrated in FIG. 1;

FIG. 3 is a cross-section on the line III—III of FIG. 2; and

FIG. 4 is an end view of one lift member.

Figure 1:
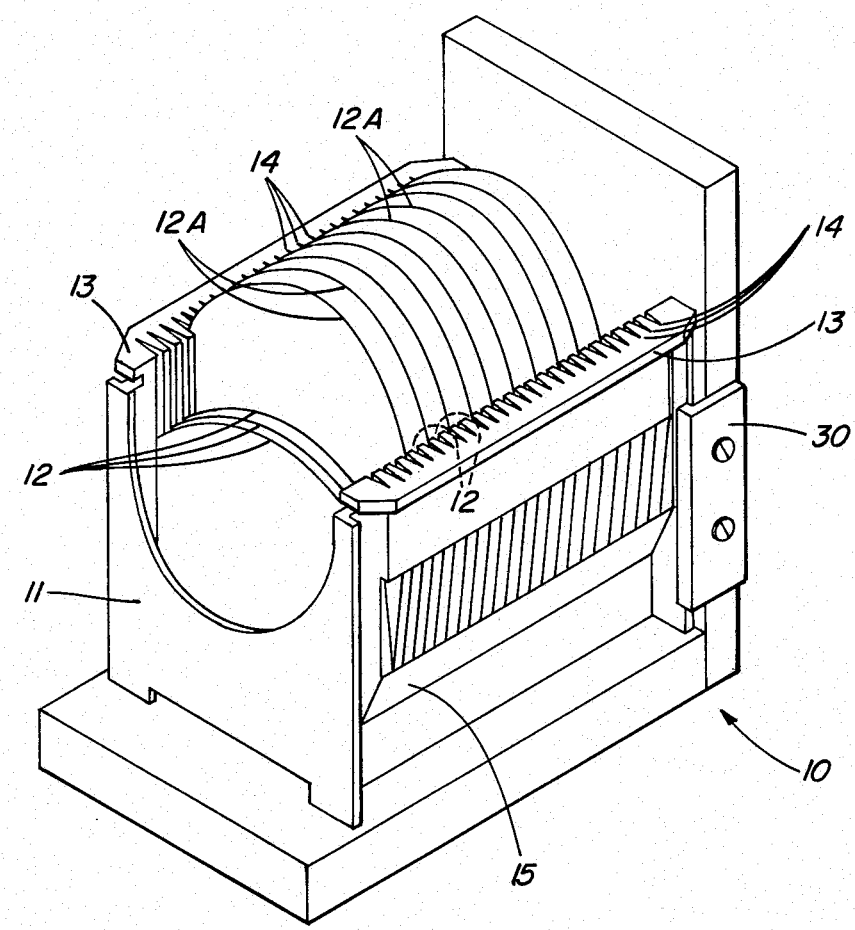
FIG. 1 is a perspective view of a jig in accordance with the invention, with a processing boat and semiconductor wafers in position on the jig.

Illustrated in FIG. 1 is the jig, indicated generally at 10, a semiconductor wafer processing boat 11, with a plurality of wafers 12. The boat 11 has spaced parallel side members 13, in which are formed Vee-shaped grooves 14, on the inside. The wafers 12 are positioned in the grooves. The boat also has bottom members 15, one on each side, which extend partly across the bottom of the boat but leave a relatively wide space between. The bottom members also have Vee-shaped grooves on their inner surfaces, which are inclined downward and inward, the wafers resting in these grooves.

The boat 11 is of conventional form, there being a variety of forms of boats used. The basic feature is wafers located in parallel, closely-spaced slots or grooves, with an opening along the bottom. The opening provides access for chemical solutions and other media during processing.

In FIG. 1, wafers 12 are resting on the bottom members, while the wafers shown at 12a, are elevated by the jig. Thus, in FIG. 1, there are wafers not elevated, between the elevated wafers 12a.

FIGS. 2 and 3 illustrate the jig 10 in more detail. It comprises a base 20, in which are formed a plurality of spaced, parallel, slots 21. In the example, the slots 21 are symmetrical about a central axis 22 of the jig. In the slots 21 are positioned lift members 23. The lift members 23 each have a Vee-shaped groove 24 extending along the top edge.

At one end of the base 20 is attached a locating member 25. Member 25 acts to locate one end of a boat, or other carrier, the slots 21 being positioned at predetermined distances from the member 25 so as to align with the wafer supporting formations in the boat. Member 25 is attached to the base by, for example, screws 26.

A lift member 23 is shown in FIG. 4. The member is of flat, plate-like, formation and is of reduced width at the bottom to form a projection 27, which fits into a slot 21. The laterally extending ledges 28 rest on the top surface of the base 20. The lift members are an easy sliding fit in the slots 21. Lateral guide members 30 can be provided at the sides of the locating member 25.

The spacing of the slots 21, and thus of the lift members 23, can vary depending upon the spacing of the wafers, or other objects, to be lifted. The number of lift members provided can also vary, as can also the positioning of the lift members if there is not one in every slot. The number and positioning can be adapted to suit which wafers are to be lifted.

The height of the lift members is such as to lift wafers sufficiently above those not lifted so as to provide easy access by a gripping tool. At the same time, the lifted wafers are also still positioned, or located, by the grooves 14 in the boat.

The form of the lift member can vary. Thus the example illustrated in FIGS. 2, 3 and 4 has a single main body portion 31, which is of a width to pass through the opening in the bottom of boat 11. However, this main body portion can be divided into two or more sections, vertically, similar to fingers. This arrangement would be necessary, for example, if instead of a single opening in the bottom of the boat, there were two or more openings extending along the boat. The basic feature is that the lift members be able to pass up into and through the boat, or other holding member and engage at their top edges with wafers or other items and lift them up to a predetermined position. Only one need be lifted or a plurality. Instead of a single lift member, a number of individual upwardly extending pins can be provided. A single pin or a plurality of pins can be provided at each lift position. The form and nature of the lift members will be influenced to some extent by the article to be lifted. Also, a lift member as in FIGS. 2 and 4, allows for some misalignment between boat and jig.

What is claimed is:

1. An elevating jig for lifting selected semiconductor wafers from a wafer holding member carrying a plurality of wafers in a parallel closely spaced array, comprising:

a base member;

a plurality of spaced parallel slots in said base member;

a plurality of removable upwardly extending lift members positioned in said slots at predetermined positions corresponding to the positions of said selected semiconductor wafers in said wafer holding member, each of said lift members including means for supporting a wafer;

a locating member at one end of said base member, said locating member having a predetermined location relative to said slots;

said predetermined positions of said lift members being such that said lift members project up through openings in a lower portion of said wafer holding member when said holding member is positioned on said base member, to lift said selected wafers in said holding member.

2. A jig as claimed in claim 1, each slot extending laterally on either side of an axis extending along said base.

3. A jig as claimed in claim 2, each lift member of a flat, plate-like, formation, and having a recessed portion at the bottom at each side to form a portion of reduced width, said recessed portion being a sliding fit in a slot, lateral edges at the top of said recessed portion resting on the top surface of said base.

4. A jig as claimed in claim 1 wherein said supporting means comprises a Vee-shaped groove extending along a top edge.

5. A jig as claimed in claim 1, said locating member extending upward from said base, and a guide member attached to each side of the locating member, said guide members extending forward over said base.

6. A method of elevating selected semiconductor wafers mounted in a semiconductor wafer holding member by use of an elevating jig having a base member, a plurality of spaced parallel slots in the base member, a pluarlity of removable, upwardly extending lift members, and a locating member at one end of the base member, said method comprising:

positioning said lift members in slots at predetermined positions corresponding to the positions of the semiconductor wafers to be elevated;

positioning said semiconductor wafer holding member against said locating member so that said lift members are aligned with the wafers to be elevated through openings in the bottom of said holding member; and lowering said holding member onto said base member such that said lift members project upwardly through said openings and elevate said selected semiconductor wafers.

* * * * *